United States Patent
Kwak et al.

(10) Patent No.: US 11,462,410 B2
(45) Date of Patent: Oct. 4, 2022

(54) SEMICONDUCTOR MANUFACTURING APPARATUS INCLUDING A BEAM SHAPER FOR SHAPING A LASER BEAM

(71) Applicant: SAMSUNG ELECTRONICS CO., LTD., Suwon-si (KR)

(72) Inventors: Nohsung Kwak, Suwon-si (KR); Euijin Seo, Incheon (KR); Jonghwi Seo, Suwon-si (KR); Jaehee Lee, Daegu (KR); Ilyoung Han, Uiwang-si (KR); Guesuk Lee, Seoul (KR)

(73) Assignee: SAMSUNG ELECTRONICS CO., LTD., Yongin-si (KR)

( * ) Notice: Subject to any disclaimer, the term of this patent is extended or adjusted under 35 U.S.C. 154(b) by 265 days.

(21) Appl. No.: 16/845,959

(22) Filed: Apr. 10, 2020

(65) Prior Publication Data
US 2021/0082704 A1 Mar. 18, 2021

(30) Foreign Application Priority Data

Sep. 16, 2019 (KR) .......................... 10-2019-0113524

(51) Int. Cl.
*H01L 21/20* (2006.01)
*H01L 21/268* (2006.01)
*B23K 26/066* (2014.01)
*B23K 26/352* (2014.01)

(52) U.S. Cl.
CPC .......... *H01L 21/268* (2013.01); *B23K 26/066* (2015.10); *B23K 26/352* (2015.10)

(58) Field of Classification Search
CPC ... H01L 21/268; B23K 26/066; B23K 26/073; B23K 26/0823; B23K 26/352
USPC ......................................................... 438/487
See application file for complete search history.

(56) References Cited

U.S. PATENT DOCUMENTS

| | | | |
|---|---|---|---|
| 6,356,341 B1 | 3/2002 | Murakami et al. | |
| 7,891,821 B2 | 2/2011 | Pang et al. | |
| 8,320,056 B2 | 11/2012 | Erlandson | |
| 8,785,815 B2 | 7/2014 | Sade et al. | |
| 9,613,815 B2 | 4/2017 | Hawryluk et al. | |
| 2015/0041672 A1* | 2/2015 | Kamikubo | H01J 37/045 |
| | | | 250/397 |
| 2018/0067392 A1* | 3/2018 | Murasato | G03F 7/0002 |

FOREIGN PATENT DOCUMENTS

| | | |
|---|---|---|
| KR | 10-0279386 | 11/2000 |
| KR | 10-2002-0004381 | 1/2002 |
| KR | 10-1186926 | 9/2012 |
| KR | 10-1343867 | 8/2013 |
| KR | 10-1928264 | 12/2016 |

* cited by examiner

*Primary Examiner* — Brook Kebede
(74) *Attorney, Agent, or Firm* — F. Chau & Associates, LLC

(57) ABSTRACT

A semiconductor manufacturing apparatus is provided including a beam shaper arranged on a light path of a laser beam and including a plurality of mask modules. The plurality of mask modules defines a light blocking region and a light transmitting region. At least one mask module of the plurality of mask modules includes a blocking plate configured to block a portion of the laser beam, and a driver is configured to move the blocking plate.

18 Claims, 17 Drawing Sheets

SEMICONDUCTOR MANUFACTURING APPARATUS INCLUDING A BEAM SHAPER FOR SHAPING A LASER BEAM

CROSS-REFERENCE TO RELATED APPLICATION

This application claims priority under 35 U.S.C. § 119 to Korean Patent Application No. 10-2019-0113524, filed on Sep. 16, 2019, in the Korean Intellectual Property Office, the disclosure of which is incorporated by reference herein in its entirety.

TECHNICAL FIELD

The present inventive concept relates to a semiconductor manufacturing apparatus, and more particularly, to a semiconductor manufacturing apparatus including a beam shaper for shaping a laser beam.

DISCUSSION OF THE RELATED ART

A semiconductor manufacturing apparatus for processing a substrate may include a laser beam for irradiating the substrate. A laser beam output from a light source is shaped by a beam shaper before irradiating the substrate. The beam shaper partially reflects the laser beam by using a reflective mask configured to reflect the laser beam and transmit the laser beam through an opening defined by the reflective mask. Since the beam shaper needs to be tailor designed in accordance with a kind of equipment or a process condition used, it is costly to design an optimized beam shaper whenever new equipment or anew process is applied.

SUMMARY

According to an exemplary embodiment of the present inventive concept, a semiconductor manufacturing apparatus is provided including a beam shaper arranged on a light path of a laser beam and including a plurality of mask modules. The plurality of mask modules defines a light blocking region and a light transmitting region. At least one mask module of the plurality of mask modules includes a blocking plate configured to block a portion of the laser beam. A driver is configured to move the blocking plate.

According to an exemplary embodiment of the present inventive concept, a semiconductor manufacturing apparatus includes a light source configured to emit a laser beam. A beam shaper is arranged on a light path of the laser beam and includes a plurality of mask modules defining a light blocking region and a light transmitting, region. At least one mask module of the plurality of mask modules includes a first blocking plate including a blocking bar defining an edge of the light transmitting region and an opening defined between the blocking bar and the first blocking plate. A second blocking plate is mounted on the first blocking plate to at least partially cover the opening of the first blocking plate. A bar actuator is configured to apply external force to the blocking bar so that the edge of the light transmitting region is concave or convex.

According to an exemplary embodiment of the present inventive concept, a semiconductor manufacturing apparatus is provided including a light source configured to emit a laser beam A beam shaper is arranged on a light path of the laser beam and includes a plurality of mask modules defining a light blocking region and a light transmitting region. Each of the plurality of mask modules includes a mask structure including a transparent substrate and a blocking plate. The blocking plate covers a part of one surface of the transparent substrate. A moving block is movably provided in a linear moving guide. A first stage is configured to support the mask structure and to rotate with respect to a first direction parallel to a direction in which the laser beam proceeds. The first direction is a rotation axis. A second stage spaced apart from the first stage. First flexure blades connect the first stage and the second stage. Second flexure blades connect the second stage and the moving block. A rotary driver is configured to apply external force to the first stage for rotating the first stage.

BRIEF DESCRIPTION OF THE DRAWINGS

Exemplary embodiments of the present inventive concept will be more clearly understood from the following detailed description taken in conjunction with the accompanying drawings in which.

DETAILED DESCRIPTION OF THE EXEMPLARY EMBODIMENTS

Figure 1:
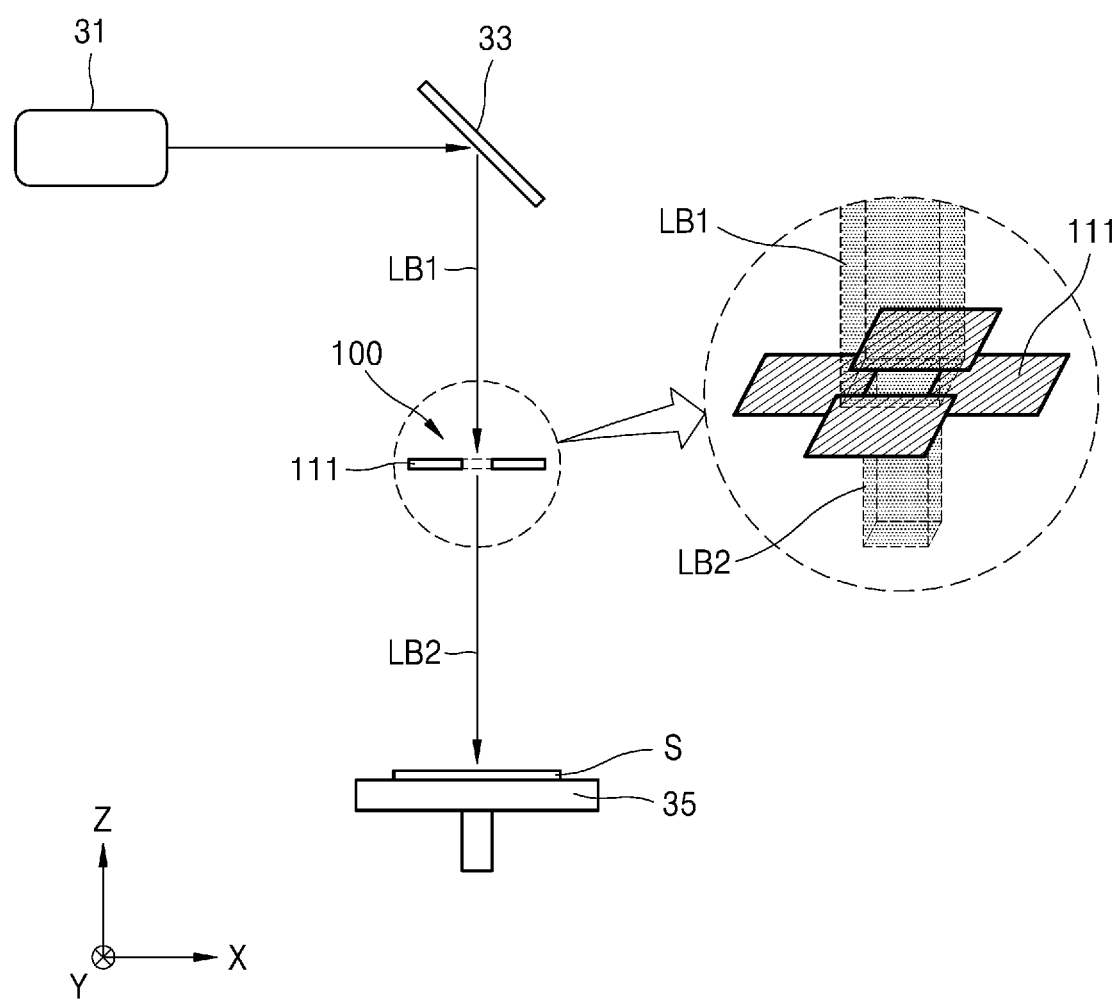
FIG. 1 is a schematic diagram illustrating a side-view of a semiconductor manufacturing apparatus, according to an exemplary embodiment of the present inventive concept.

Hereinafter, exemplary embodiments of the present inventive concept will be described in detail with reference to the accompanying drawings. Like reference numerals may refer to like elements throughout the specification and the drawings. Redundant description of elements described elsewhere in this application may be omitted for brevity. FIG. 1 is a schematic diagram illustrating a side-view of a semiconductor manufacturing apparatus 10, according to an exemplary embodiment of the present inventive concept.

Referring to FIG. 1, the semiconductor manufacturing apparatus 10 may include a light source 31, a beam shaper 100, and a stage 35.

The light source 31 may emit a laser beam LB1. The light source 31 may include a laser generator for emitting the laser beam LB1 having a wavelength of about 400 nm to about 600 nm. In an exemplary embodiment of the present inventive concept, the light source 31 may include a laser generator for emitting an excimer laser beam.

The laser beam LB1 emitted from the light source 31 is reflected by a reflective mirror 33 positioned in a light path of the laser beam LB1. The reflected laser beam LB1 may be orthogonally reflected with respect to an original trajectory of the laser beam LB1 owing to an angle of the reflective mirror 33. The reflected laser beam LB1 then proceeds through the beam shaper 100 and irradiates substrate S mounted on the stage 35. The beam shaper 100 is arranged on a light path of the laser beam LB1 and may shape the laser beam LB1 prior to irradiating the substrate S. For example, the beam shaper 100 may control a shape and size of a horizontal cross-section of the laser beam LB1. Here, the horizontal cross-section of the laser beam LB1 may mean a cross-section of the laser beam LB1 on a plane (for example, an X-Y plane) substantially perpendicular to a direction (for example, a Z direction) in which the laser beam LB1 proceeds.

In an exemplary embodiment of the present inventive concept, the beam shaper 100 may include first to fourth blocking plates 111 formed of a material capable of blocking or reflecting the laser beam LB1. The first to fourth blocking plates 111 may define a light blocking region and a light transmitting region (11 of FIG. 2) therebetween. The laser beam LB1 is blocked or reflected by the light blocking region. The remainder of the laser beam LB1 passes through the central light transmitting region 11 which is at least partially surrounded by the light blocking region. Since the beam shaper 100 selectively transmits the laser beam LB1 only through the light transmitting region 11, a horizontal cross-section of a laser beam LB2 that passes through the beam shaper 100 may be controlled by a shape and size of the light transmitting region 11.

For example, as illustrated in FIG. 1, by the first to fourth blocking plates 111 arranged in a circular arrangement with a central gap (e.g., arranged in a clockwise direction), the light transmitting region 11 may be defined to be quadrangular. Here, the shape of the light transmitting region 11 may mean the shape of the light transmitting region 11 seen in the direction in which the laser beam LB1 proceeds (e.g., in a plan view). The light transmitting region 11 may be rectangular. However, the present inventive concept is not limited thereto. For example, the light transmitting region 11 may be square, parallelogram-shaped, or diamond-shaped.

The first to fourth blocking plates 111 may define the light transmitting region 11 to be, for example, polygonal, for example, triangular, or pentagonal. Alternatively, the first to fourth blocking plates 111 may define the light transmitting region 11 to be circular or elliptical.

Adjacent blocking plates 111 may overlap each other at corners thereof. For example, blocking plates 111 spaced apart in the Y direction may have facing corners disposed superior to respective adjacent corners of the blocking plates 111 spaced apart in the X direction.

The stage 35 may support a material processed by using the laser beam LB1. For example, the stage 35 may support the substrate S. In an exemplary embodiment of the present inventive concept, the substrate S may include a semiconductor, such as silicon (Si) and/or germanium (Ge), or a compound semiconductor, such as Silicon-germanium (SiGe), Silicon Carbide (SiC), Gallium Arsenide (GaAs), Indium Arsenide (InAs) and/or Indium Phosphide (InP). In an exemplary embodiment of the present inventive concept, the substrate S may include a conductive region, for example, a well doped with impurities or a structure doped with impurities.

In an exemplary embodiment of the present inventive concept, the stage 35 may be an electrostatic chuck configured to support the loaded substrate S by using electrostatic force. In an exemplary embodiment of the present inventive concept, the stage 35 may be a vacuum chuck configured to support the loaded substrate S by using vacuum pressure. In addition, the stage 35 may include a stage driver for moving and rotating the stage 35. The stage driver may move and rotate the stage 35 while a material is processed by using the laser beam LB2 shaped by the beam shaper 100.

In an exemplary embodiment of the present inventive concept, the semiconductor manufacturing apparatus 10 may be a laser annealing apparatus configured to perform a laser annealing process on the substrate S by using the laser beam LB1. For example, the semiconductor manufacturing apparatus 10 may crystallize an amorphous silicon layer of the substrate S into a polysilicon layer by irradiating the substrate S with the laser beam LB2. According to an exemplary embodiment of the present inventive concept, the semiconductor manufacturing apparatus 10 may perform a laser doping process of introducing impurities to a semiconductor or a laser deposition process of forming a metal layer and/or an oxide layer by irradiating the substrate S with the laser beam LB2.

FIGS. 2, 3, 4A and 4B are plan-views illustrating methods of operating the beam shaper 100 of FIG. 1, according to exemplary embodiments of the present inventive concept.

Figure 2:
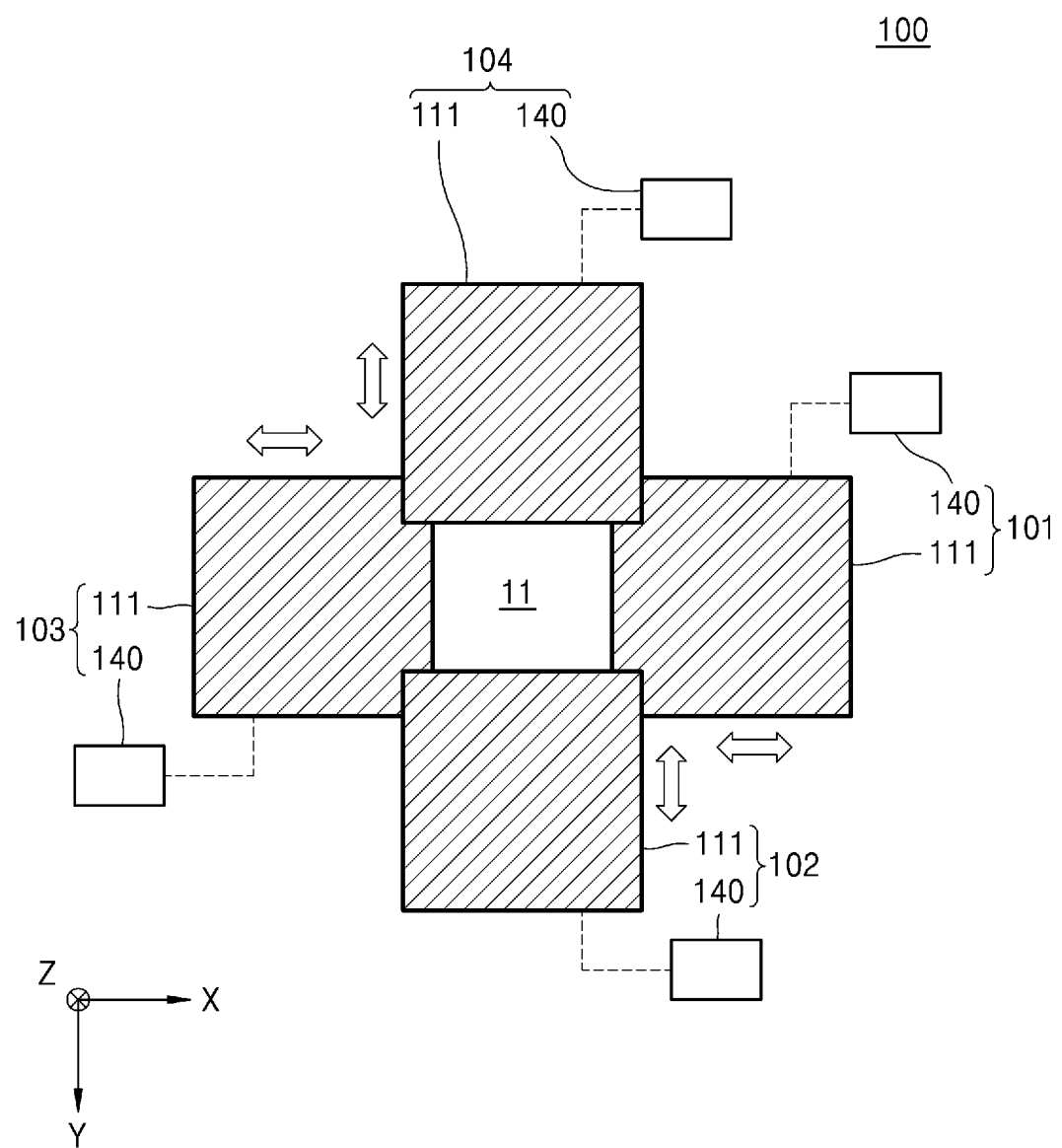
FIGS. 2, 3, 4A and 4B are plan-views illustrating methods of operating the beam shaper of FIG. 1, according to exemplary embodiments of the present inventive concept.

Referring to FIGS. 1 and 2, the beam shaper 100 may include first to fourth mask modules 101, 102, 103, and 104 arranged in the clockwise direction. Each of the first to fourth mask modules 101, 102, 103, and 104 may include a blocking plate 111 and a driver for moving the blocking plate 111 (e.g., a linear driver 140).

The linear driver 140 may linearly move the blocking plate 111. For example, the linear driver 140 may make the blocking plate 111 linearly reciprocate in a first or a second horizontal direction (for example, an X direction and/or a Y direction, respectively) perpendicular to a third direction (for example, the Z direction) in which the laser beam LB1 proceeds. In an exemplary embodiment of the present inventive concept, the linear driver 140 may include a linear actuator.

In an exemplary embodiment of the present inventive concept, the size and shape of the light transmuting region 11 may be controlled by individually controlling movement (e.g., linear movement) of the first to fourth blocking plates 111. For example, in order to control a width in a first horizontal direction (for example, the X direction) of the transmitting region 11, the blocking plate 111 of the first mask module 101 and/or the blocking plate 111 of the third mask module 103 that are spaced apart from each other in the first horizontal direction (e.g., the X direction) may be moved in the first horizontal direction (e.g., the X direction). In addition, in order to control a width in a second horizontal direction (for example, the Y direction) of the transmitting region 11, the blocking plate 111 of the second mask module 102 and/or the blocking plate 111 of the fourth mask module 104 that are apart from each other in the second horizontal direction (e.g., the Y direction) may be moved in the second horizontal direction (e.g., the Y direction).

Figure 3:
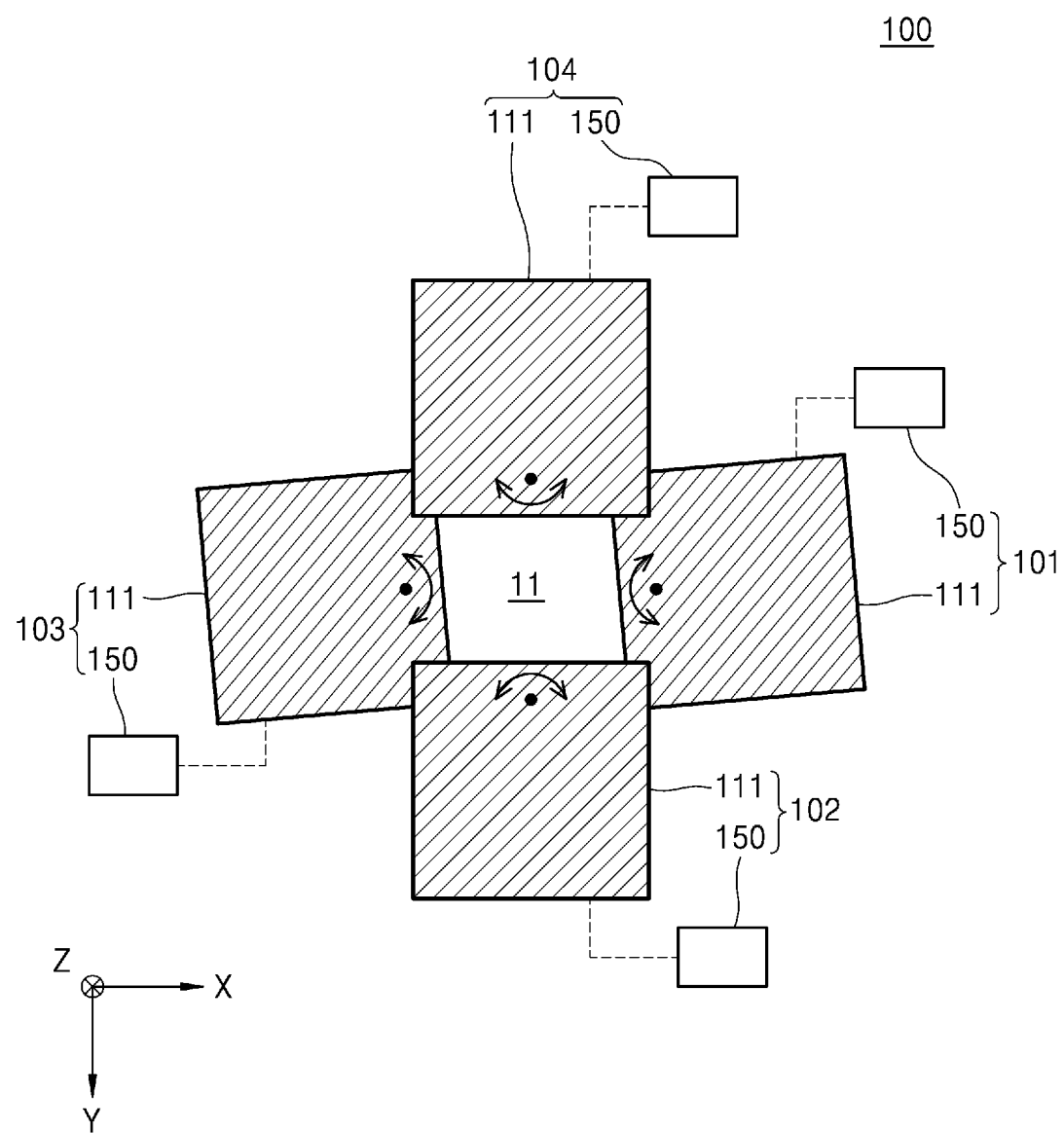

Referring to FIGS. 1 and 3, the beam shaper 100 may include the first to fourth mask modules 101, 102, 103, and 104 arranged in the clockwise direction. Each of the first to fourth mask modules 101, 102, 103, and 104 may include the blocking plate 111 and a rotary driver 150.

The rotary driver 150 may rotate the blocking plate 111. For example, the rotary driver 150 may rotate the blocking plate 111 with respect to a third direction (for example, the Z direction) parallel to the direction in which the laser beam LB1 proceeds as a rotation axis. In an exemplary embodiment of the present inventive concept, the blocking plate 111 may rotate in a fine range of less than 1°, 0.5°, or 0.2° with respect to a rotation axis (e.g., an axis of the Z direction). In an exemplary embodiment of the present inventive concept, the rotary driver 150 may include a piezoelectric actuator capable of precisely controlling a fine rotary motion of the blocking plate 111.

In an exemplary embodiment of the present inventive concept, by individually controlling the rotation of the first to fourth blocking plates 111, skewness of the light transmitting region 11 may be controlled. By rotating at least some of the first to fourth blocking plates 111 with respect to the third direction (e.g., the Z direction) as the rotation axis, an angle between adjacent two edges of the light transmitting region 11 may be controlled and the shape of the light transmitting region 11 may be controlled. Skewness of the light transmitting region 11 may refer to a condition in which adjacent sides of the light transmitting region 11 are not orthogonally connected.

In an exemplary embodiment of the present inventive concept, lateral sides of each of the blocking plates 111 may be asymmetrical in a plan view, and thus a shape of the light transmitting region 11 may be changed by rotations of the blocking plates 111 such that a differently shaped side is rotated to face the light transmitting region 11.

Figure 4A:
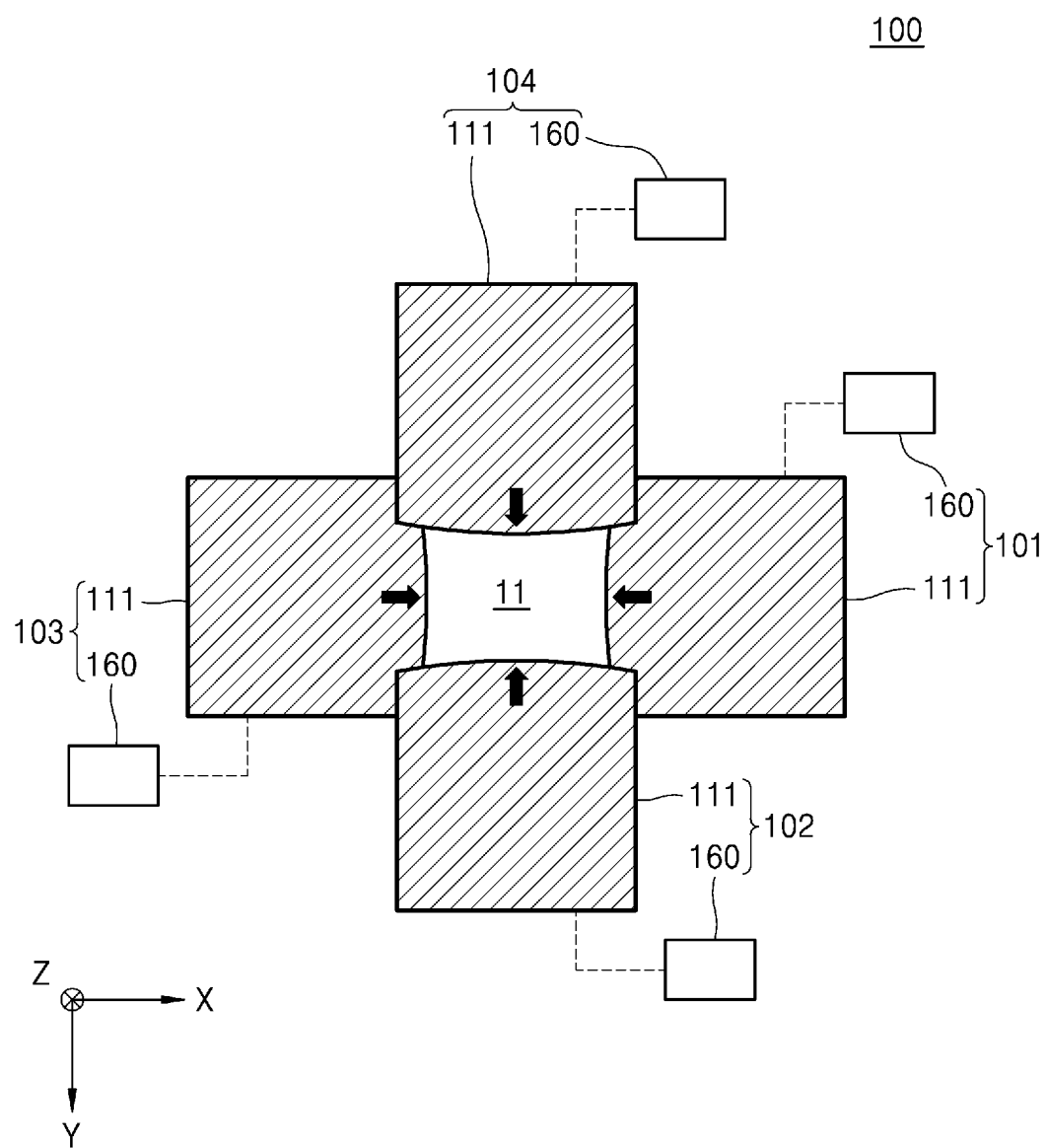
Figure 4B:
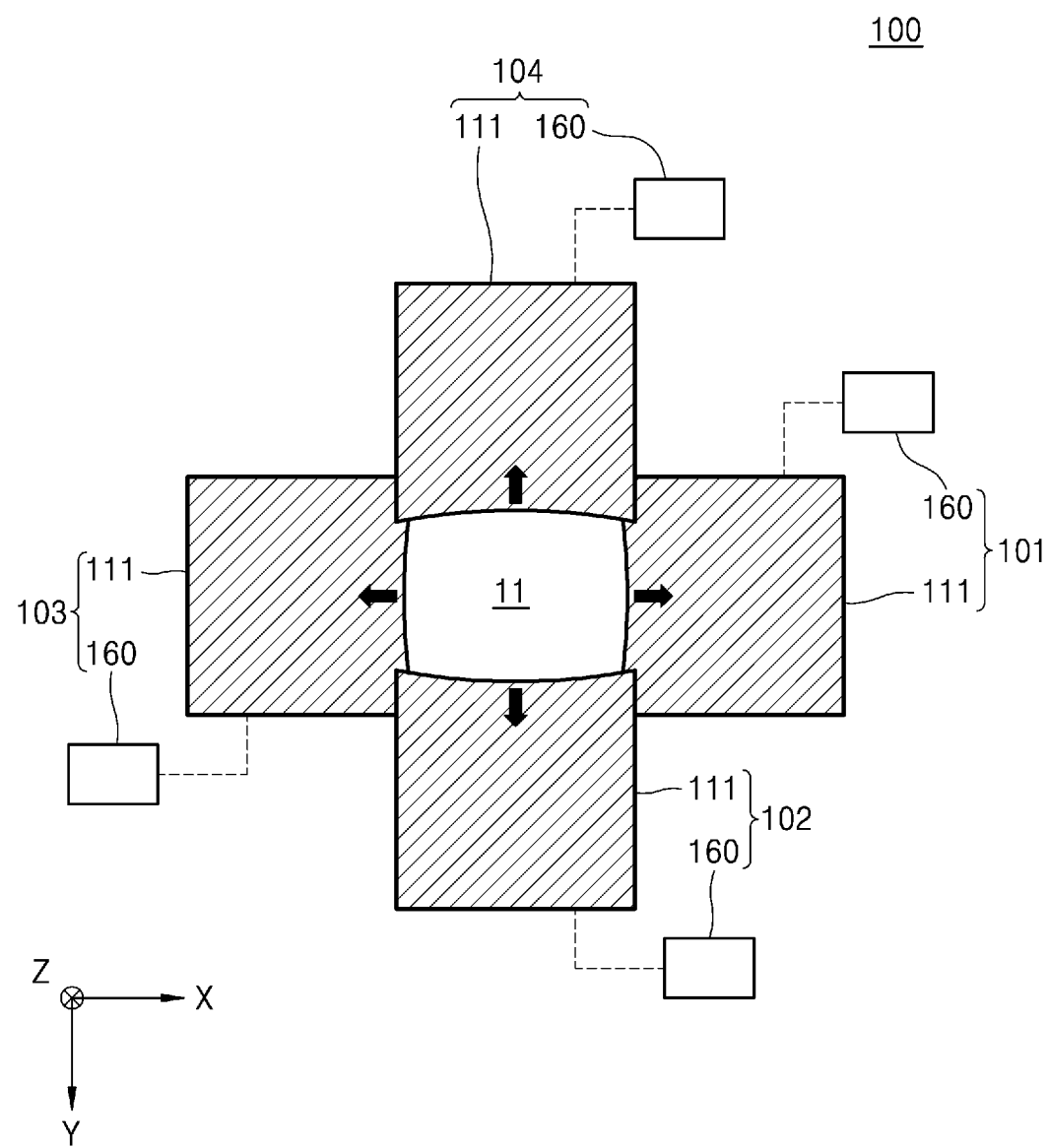

Referring to FIGS. 1, 4A and 4B, the beam shaper 100 may include the first to fourth mask modules 101, 102, 103 and 104 arranged in the clockwise direction. Each of the first to fourth mask modules 101, 102, 103 and 104 may include the blocking plate 111 and an actuator 160.

The actuator 160 may apply external force for elastically transforming the blocking plate 111 to the blocking plate 111. For example, the actuator 160 may elastically transform an edge of the blocking plate 111, which contacts the light transmitting region 11, to be concave or convex by applying external force to the blocking plate 111. In an exemplary embodiment of the present inventive concept, displacement of the center of the edge of the blocking plate 111, which contacts the light transmitting region 11, may be less than 100 μm, 50 μm, or 30 μm. In an exemplary embodiment of the present inventive concept, the actuator 160 may include the piezoelectric actuator capable of precisely controlling fine transformation of the blocking plate 111.

In an exemplary embodiment of the present inventive concept, the beam shaper 100 may correct radial distortion of the laser beam LB1 by transforming edges of the first to fourth blocking plates 111. The radial distortion of the laser beam LB1 may include barrel distortion in which an edge of the laser beam LB1 is curved outward to be convex and pincushion distortion in which the edge of the laser beam LB1 is curved inward to be concave. The beam shaper 100 may correct the radial distortion of the laser beam LB1 by transforming the edges of the first to fourth blocking plates 111 in a direction opposite to a direction in which the edge of the laser beam LB1 is curved.

In an exemplary embodiment of the present inventive concept, when the barrel distortion occurs in the laser beam LB1, as illustrated in FIG. 4A, the actuator 160 may correct the barrel distortion by transforming an edge of the blocking plate 111 to be convex. For example, the actuator 160 may correct the barrel distortion by transforming the edge of the blocking plate 111 adjacent to the light transmitting region 11 to be convex. In other words, the actuator 160 may correct the barrel distortion by transforming an edge of the light transmitting region 11 to be concave.

In an exemplary embodiment of the present inventive concept, when the pincushion distortion occurs in the laser beam LB1, as illustrated in FIG. 4B, the actuator 160 may correct the pincushion distortion by transforming an edge of the blocking plate 111 to be concave. For example, the actuator 160 may correct the pincushion distortion by transforming the edge of the blocking plate 111 adjacent to the light transmitting region 11 to be concave. In other words, the actuator 160 may correct the pincushion distortion by transforming an edge of the light transmitting region 11 to be convex.

Figure 5A:
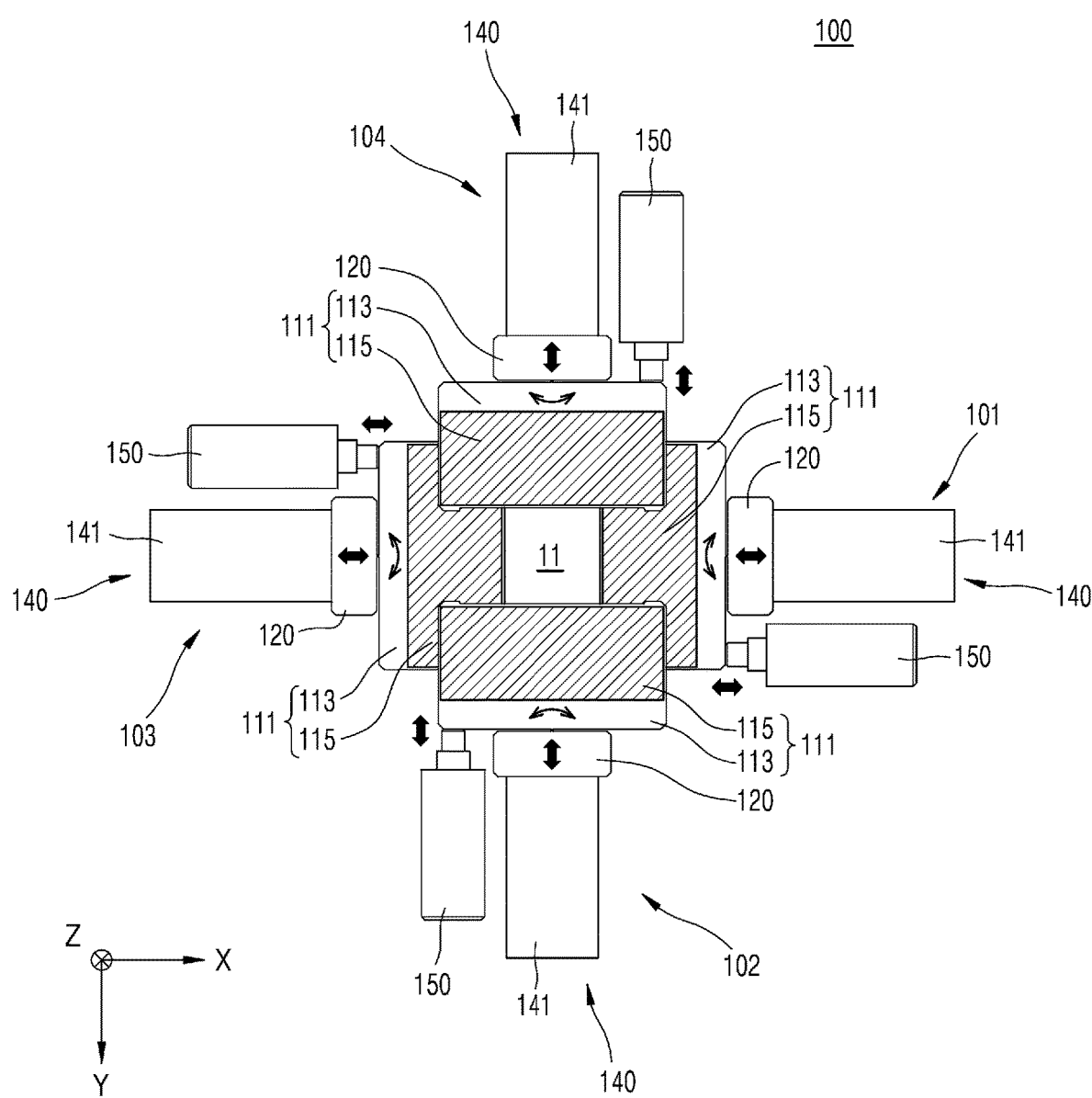
FIGS. 5A and 5B are plan views illustrating a beam shaper, according to exemplary embodiments of the present inventive concept.
Figure 5B:
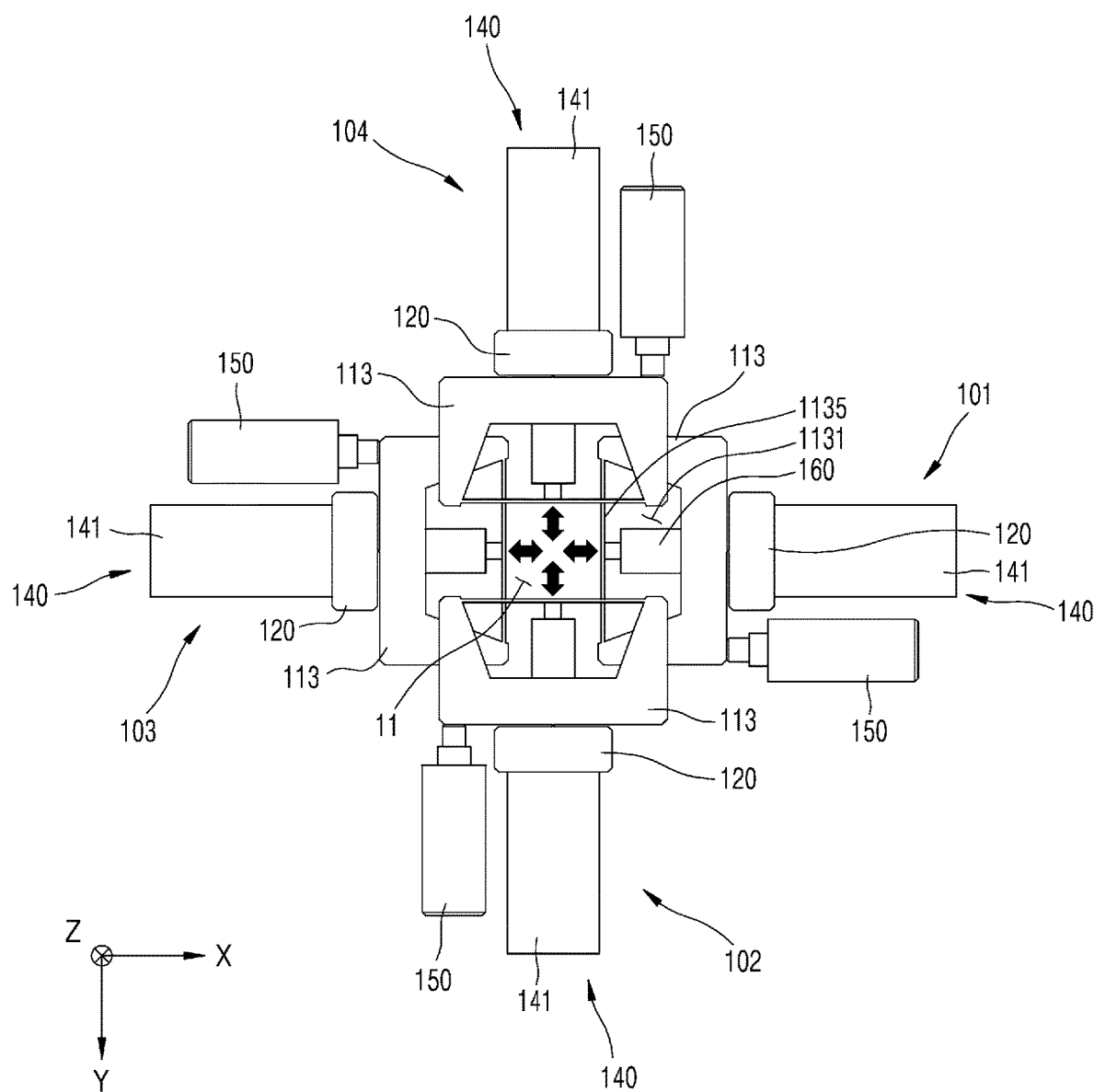

FIGS. 5A and 5B are plan views illustrating the beam shaper 100 according to exemplary embodiments of the present inventive concept. FIG. 5B illustrates the beam shaper 100 from which second blocking plates 115 illustrated in FIG. 5A are removed.

Referring to FIGS. 5A and 5B, the beam shaper 100 may include a plurality of mask modules. The plurality of mask modules may define the light blocking region and the light transmitting region 11 and may control the size and shape of the light transmitting region 11 in cooperation with each other. For example, the beam shaper 100 may include the first to fourth mask modules 101, 102, 103, and 104. In a plan view, the second to fourth mask modules 102, 103, and 104 may be arranged in positions rotated at 90°, 180°, and 270° with respect to the first mask module 101 in the clockwise direction.

Each of the first to fourth mask modules 101, 102, 103, and 104 may include the blocking plate 111, a moving block 120, the linear driver 140, and the rotary driver 150.

The first to fourth blocking plates 111 included in the first to fourth mask modules 101, 102, 103, and 104 may define the light transmitting region 11 to be quadrangular in cooperation with each other. The light transmitting region 11, which is quadrangular, may be an opening defined by the first to fourth blocking plates 111. The first to fourth blocking plates 111 included in two adjacent mask modules among the first to fourth mask modules 101, 102, 103, and 104 may be spaced apart from each other in a vertical direction (e.g., the Z direction). Since the adjacent blocking plates 111 are spaced apart from each other, one blocking plate 111 may move without colliding or interfering with another blocking plate 111.

In an exemplary embodiment of the present inventive concept, each of the first to fourth blocking plates 111 may include a first blocking plate 113 and a second blocking plate 115 mounted on the first blocking plate 113. The first blocking plate 113 may include a blocking bar 1135 that defines an edge of the light transmitting region 11 and an opening 1131 that contacts or reaches the blocking bar 1135. For example, the first blocking plate 113 may have a first side surface disposed between curved second side surfaces which extend oppositely away from the first side surface of the first blocking plate 113. The blocking bar 1135 may be disposed in parallel to the first side surface of the first blocking plate 113 and between end portions of the curved second side surfaces of the first blocking plate 113. The opening 1131 may be defined between a surface of the blocking bar 1135 facing the first side surface of the first blocking plate 113 and the first side surface of the first blocking plate 113. The second blocking plate 115 may be mounted on the first blocking plate 113 to cover the opening 1131 of the first blocking plate 113 and an upper surface of the first blocking plate 113. The second blocking plate 150 may prevent the laser beam LB1 from passing through the opening 1131 of the first blocking plate 113.

The moving block 120 may be disposed on the blocking plate 111. For example, the moving block 120 may support the blocking plate 111. The moving block 120 is movably provided in a linear moving guide (143 of FIG. 7) and may be guided by the linear moving guide 143 and may linearly move. For example, the blocking plate 111 supported by the moving block 120 may move together with the moving block 120 when the moving block 120 moves.

The linear driver 140 may linearly move the moving block 120 and the blocking plate 111 supported by the moving block 120. For example, the linear driver 140 may include a linear actuator 141, the linear moving guide 143 for guiding the linear movement of the moving block 120, and a linear encoder.

As previously described with reference to FIG. 2, by individually controlling linear movements of the first to fourth blocking plates 111, the size of the light transmitting region 11 may be controlled. For example, the linear drivers 140 included in the first and third mask modules 101 and 103 may control a width of the light transmitting region 11 in the first horizontal direction (for example, the X direction) by linearly moving the moving blocks 120 in the first horizontal direction (e.g., the X direction). In addition, the linear drivers 140 included in the second and fourth mask modules 102 and 104 may control a width of the light transmitting region 11 in the second horizontal direction (for example, the Y direction) by linearly moving the moving blocks 120 in the second horizontal direction (e.g., the Y direction).

Figure 6A:
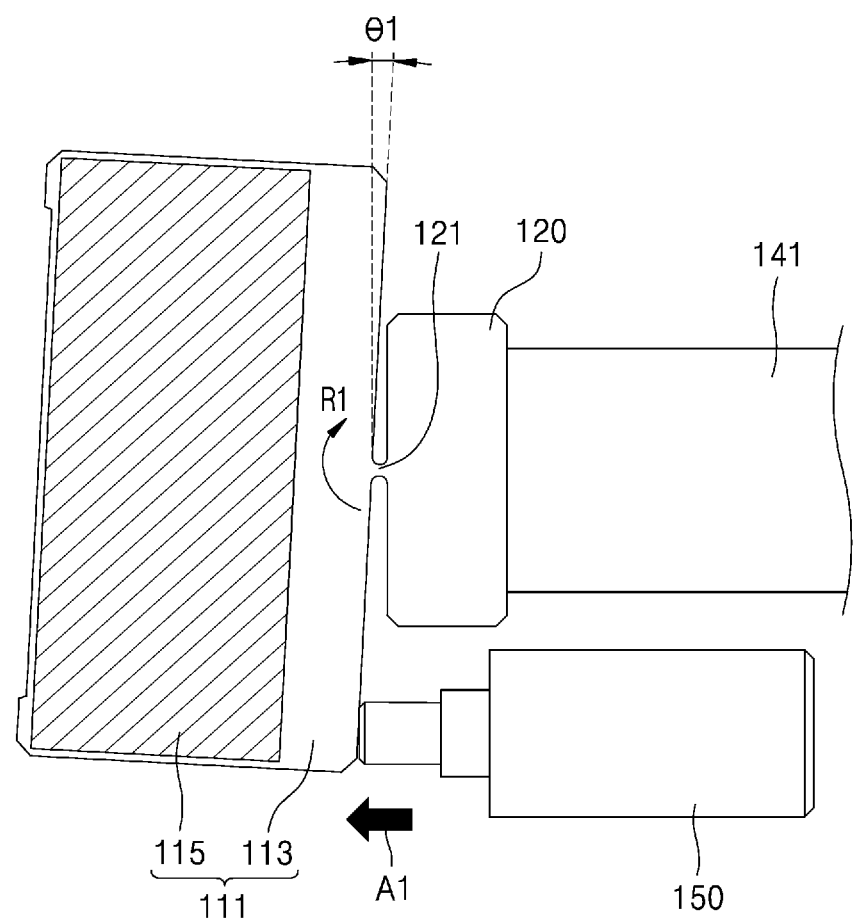
FIGS. 6A and 6B are plan views illustrating a pan of a beam shaper in order to describe a rotary motion of a blocking plate, according to an exemplary embodiment of the present inventive concept.
Figure 6B:
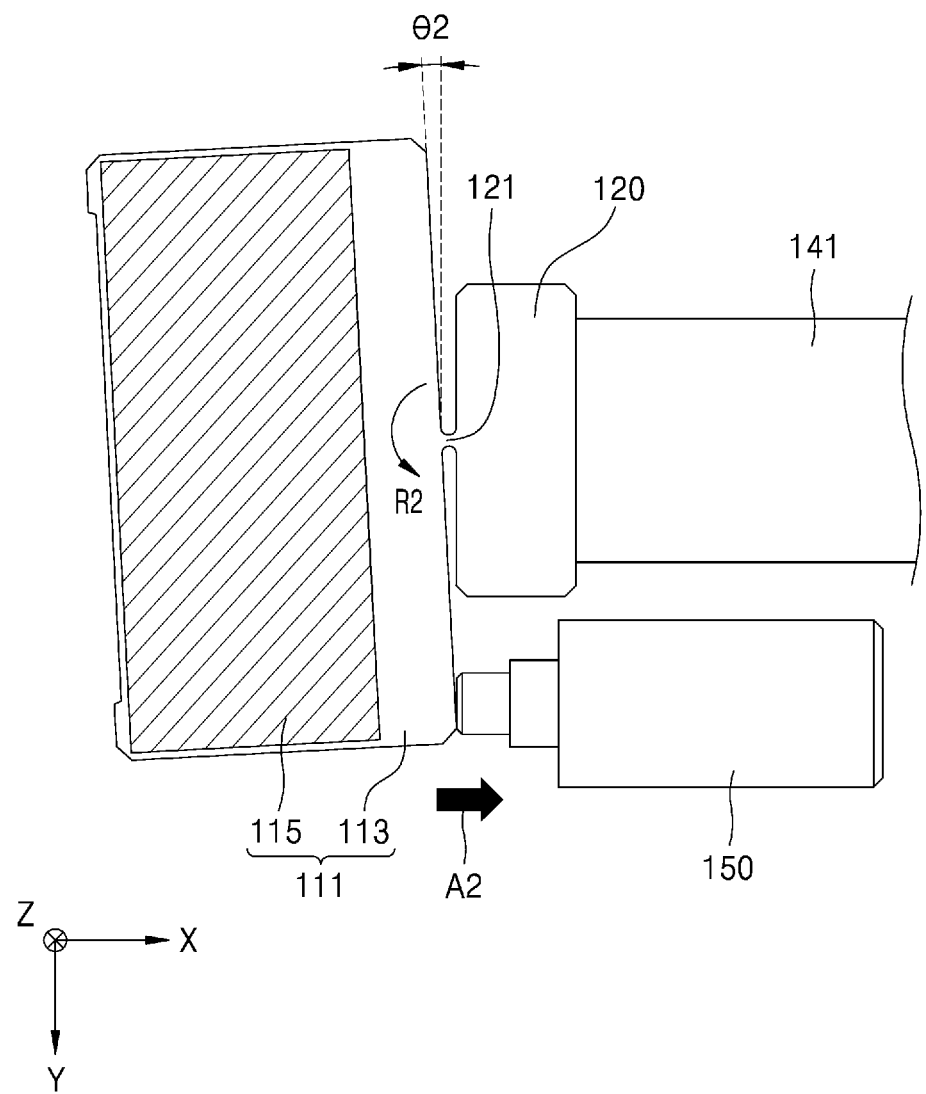
Figure 7:
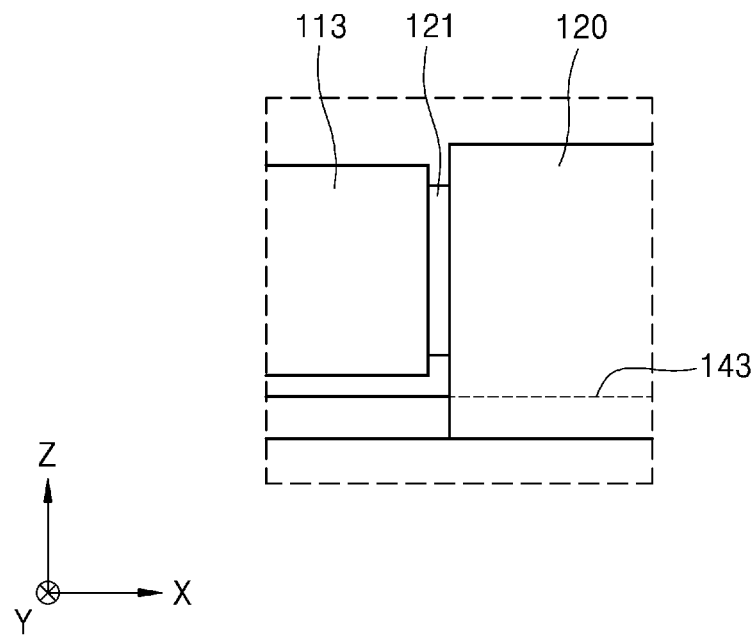
FIG. 7 is a cross-sectional view illustrating a part of the beam shaper of FIG. 6A, according to an exemplary embodiment of the present inventive concept.

FIGS. 6A and 6B are plan views illustrating a part of a beam shaper in order to describe a rotary motion of a blocking plate, according to an exemplary embodiment of the present inventive concept. FIG. 7 is a cross-sectional view illustrating a part of the beam shaper of FIG. 6A, according to an exemplary embodiment of the present inventive concept.

Referring to FIGS. 5A, 5B, 6A, 6B and 7, each of the first to fourth mask modules 101, 102, 103, and 104 may include a flexure hinge 121 for connecting the blocking plate 111 and the moving block 120 to each other. The flexure hinge 121 may be a swivel joint provided between the blocking plate 111 and the moving block 120. For example, the flexure hinge 121 may be disposed on a surface of the first blocking plate 113 that is opposite to the light transmitting region 11. The flexure hinge 121 may extend in the third direction (for example, the Z direction) parallel to the direction in which the laser beam LB1 proceeds and may allow the blocking plate 111 to rotate about an axis of the third direction (also referred to herein as the rotation axis) and may limit a rotary motion of the blocking plate 111 in another direction (e.g., around an axis of the first horizontal direction or the second horizontal direction).

In an exemplary embodiment of the present inventive concept, the first blocking plate 113, the moving block 120, and the flexure hinge 121 may form one body (e.g. integrated or cooperatively coupled).

The rotary driver 150 may rotate the blocking plate 111 by using the third direction (e.g., the Z direction) as the rotation axis. The rotary driver 150 may include an actuator configured to apply external force for rotating the blocking plate 111 to the blocking plate 111. The actuator of the rotary driver 150 may apply external force to a point of the first blocking plate 113 spaced apart from the flexure hinge 121 in a first horizontal direction (e.g., the X direction) or a second horizontal direction (e.g., the Y direction). For example, the actuator of the rotary driver 150 may be connected to the an end portion of the first blocking plate 113 and may push or pull the contacted end portion of the first blocking plate 113.

As illustrated in FIG. 6A, when the rotary driver 150 applies external force to the first blocking plate 113 in a direction A1 in which the rotary driver 150 pushes the first blocking plate 113, since the external force functions as torque that rotates the first blocking plate 113, the first blocking plate 113 may rotate based on the flexure hinge 121 on the X-Y plane in a first rotation direction R1.

In addition, as illustrated in FIG. 6B, when the rotary driver 150 applies external force to the first blocking plate 113 in a direction A2 in which the rotary driver 150 pulls the first blocking plate 113, since the external force functions as torque that rotates the first blocking plate 113, the first blocking plate 113 may rotate based on the flexure hinge 121 on the X-Y plane in a second rotation direction R2.

The rotation of the first blocking plate 113 in the first rotation direction R1 and the rotation of the first blocking plate 113 in the second rotation direction R2 may be minutely implemented by the elastic transformation of the flexure hinge 121. In an exemplary embodiment of the present inventive concept, a rotation angle $\theta 1$ of the first blocking plate 113 in the first rotation direction R1 and a rotation angle $\theta 2$ of the first blocking plate 113 in the second rotation direction R2 may be implemented in a fine range of less than 1°, 0.5°, or 0.2° with respect to a rotation axis (e.g., an axis of the Z direction). For example, the rotation angles $\theta 1$ and $\theta 2$ may represent angles of deviation of a surface of the first blocking plate 113 towards or away from the moving block 120 from a resting position.

In an exemplary embodiment of the present inventive concept, the actuator of the rotary driver 150 may include a piezoelectric actuator capable of precisely controlling the rotation of the blocking plate 111. However, the present inventive concept is not limited thereto.

As described with reference to FIG. 3, the rotary drivers 150 may control a skewness of the light transmitting region 11 by individually controlling the rotations of the first to fourth blocking plates 111. For example, by rotating at least one of two adjacent blocking plates 111, the shape of the light transmitting region 11 or an angle between two adjacent edges of the light transmitting region 11 may be controlled.

Figure 8A:
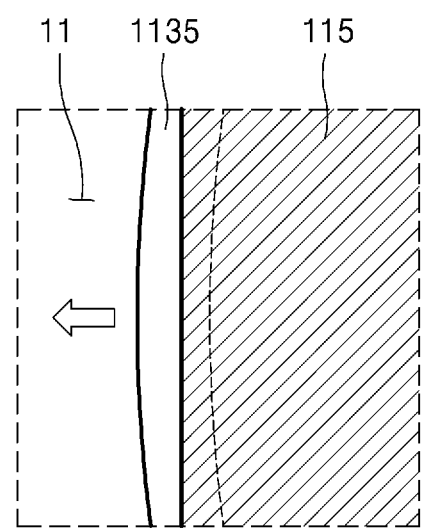
FIGS. 8A and 8B are enlarged plan-views illustrating a method of transforming an edge of a light transmitting region to be concave or convex by transforming a blocking bar of a first blocking plate, according to an exemplary embodiment of the present inventive concept.
Figure 8B:
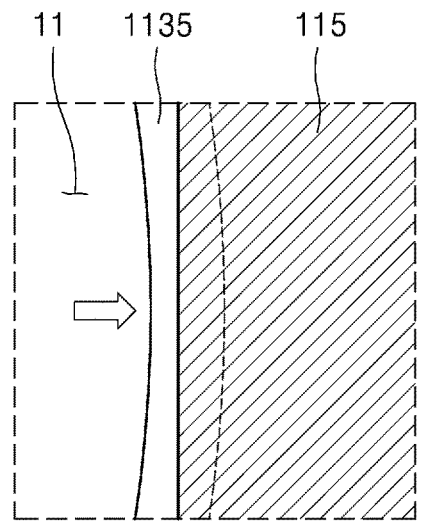

FIGS. 8A and 8B are enlarged plan-views illustrating a method of transforming an edge of the light transmitting region 11 to be concave or convex by transforming the blocking bar 1135 of the first blocking plate 113.

Referring to FIGS. 8A and 8B together with FIG. 5B, each of the first to fourth mask modules 101, 102, 103, and 104 may include the bar actuator 160 so as to transform the blocking bar 1135. The bar actuator 160 may apply external force to the blocking bar 1135 so that the blocking bar 1135 is elastically transformed. For example, the bar actuator 160 may be connected to the center of the blocking bar 1135 and may push or pull the center of the blocking bar 1135. The elastic transformation of the blocking bar 1135 is implemented in a fine range. For example, displacement of the center of the blocking bar 1135 in the first horizontal direction (e.g., the X direction) or the second horizontal direction (e.g., the Y direction) may be less than 100 μm, 50 μm, or 30 μm.

According to an exemplary embodiment of the present inventive concept, the actuator 160 may retract or extend in a horizontal direction to provide the pulling or pushing force, respectively.

In an exemplary embodiment of the present inventive concept, the bar actuator 160 may include a piezoelectric actuator capable of precisely controlling the elastic transformation of the blocking bar 1135. However, the present inventive concept is not limited thereto.

As previously described with reference to FIGS. 4A and 4B, the bar actuators 160 included in the first to fourth mask modules 101, 102, 103, and 104 may correct the barrel distortion or pincushion distortion of the laser beam LB1 by controlling directions in which the centers of the blocking bars 1135 are curved.

In an exemplary embodiment of the present inventive concept, when the barrel distortion occurs in the laser beam LB1, the bar actuator 160 may correct the barrel distortion by transforming the blocking bar 1135 so that an edge of the blocking bar 1135 is curved toward the center of the light transmitting region 11.

In an exemplary embodiment of the present inventive concept, when the pincushion distortion occurs in the laser beam LB1, the bar actuator 160 may correct the pincushion distortion by transforming the blocking bar 1135 so that an edge of the blocking bar 1135 is curved to be away from the center of the light transmitting region 11.

Figure 9:
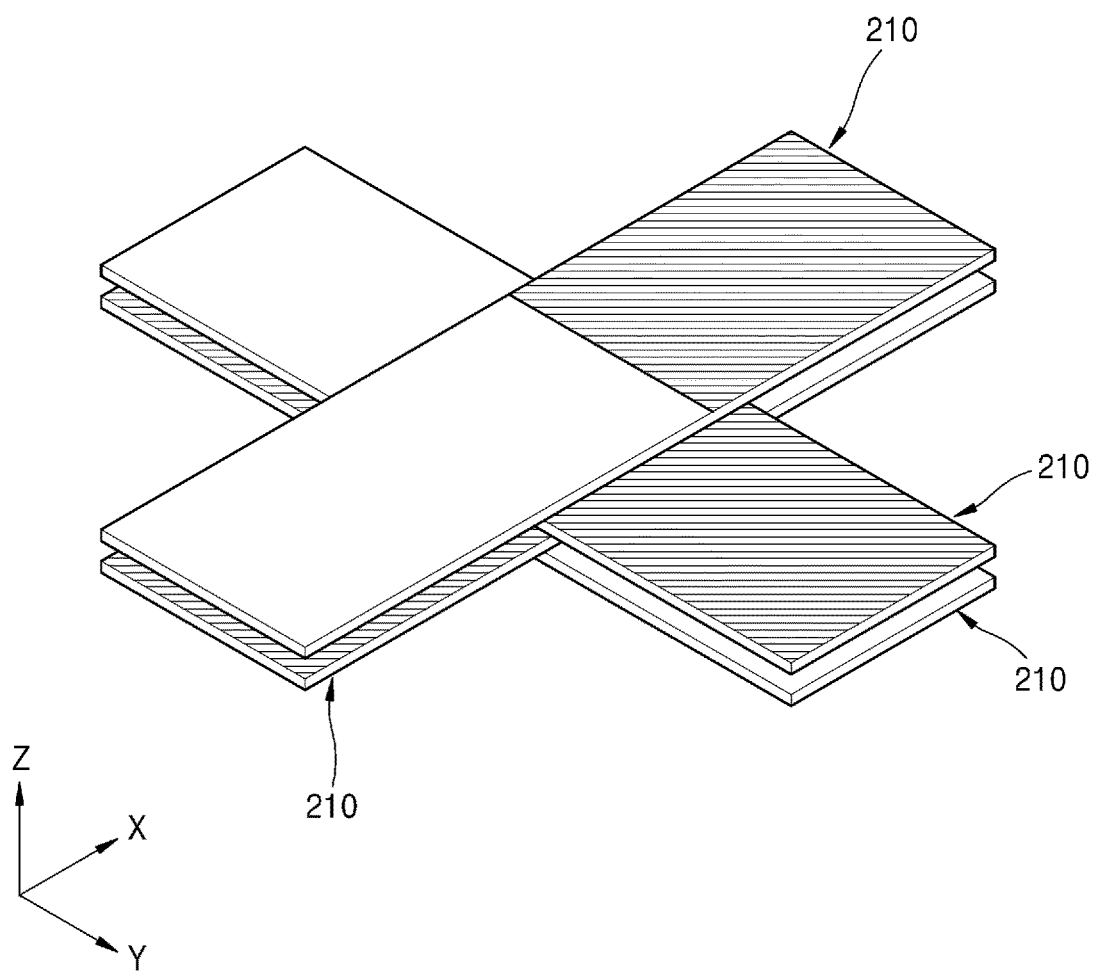
FIG. 9 is a perspective view schematically illustrating mask structures included in a beam shaper according, to an exemplary embodiment of the present inventive concept.
Figure 10:
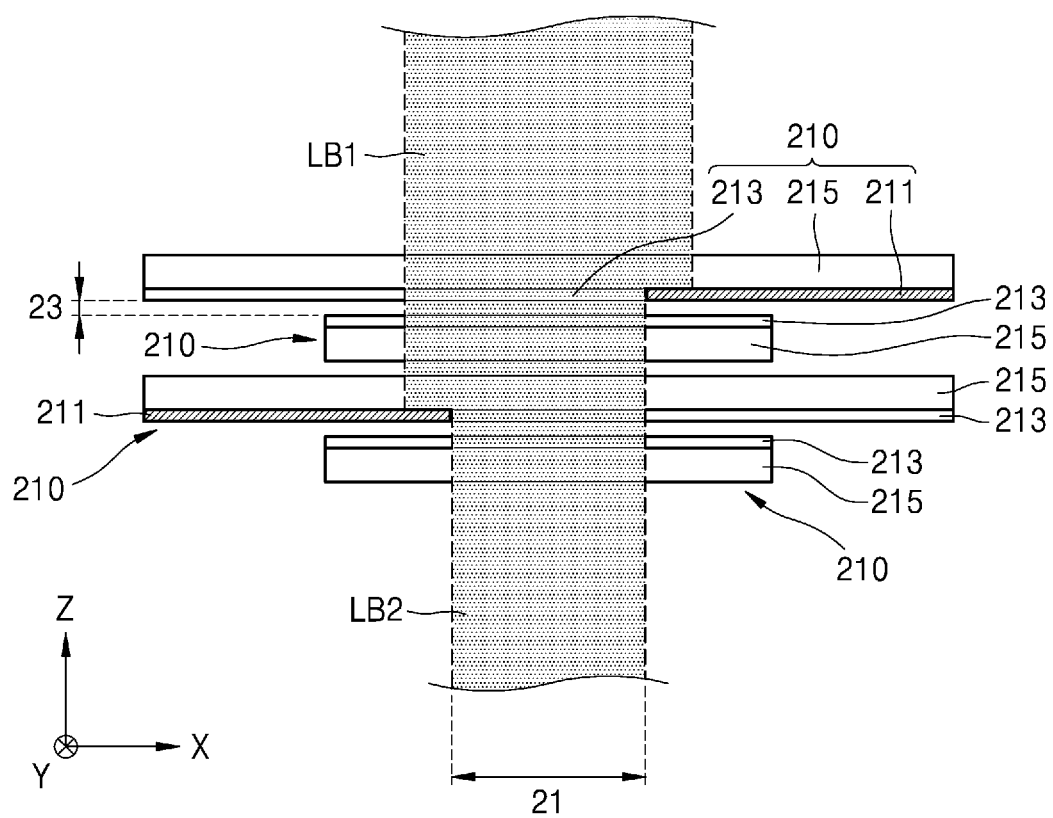
FIG. 10 is a cross-sectional view schematically illustrating mask structures included in a beam shaper according to an exemplary embodiment of the present inventive concept.

FIG. 9 is a perspective view schematically illustrating a plurality of mask structures 210 included in a beam shaper 200, according to an exemplary embodiment of the present inventive concept. FIG. 10 is a cross-sectional view schematically illustrating a plurality of mask structures 210 included in a beam shaper 200, according to an exemplary embodiment of the present inventive concept.

Referring to FIGS. 9 and 10, the beam shaper 200 may include the plurality of mask structures 210 that define a light blocking region and a light transmitting region 21 in cooperation with each other. For example, each of the plurality of mask structures 210 may shape the laser beam LB1 incident on the beam shaper 200 by selectively transmitting the laser beam LB1.

The light transmitting region 21 may be defined by blocking plates 211 included in the plurality of mask structures 210. For example, when the beam shaper 200 includes a plurality of mask structures 210, in a plan view, around the uppermost mask structure 210, the remaining three mask structures 210 may be arranged in positions rotated at 90°, 180°, and 270° in the clockwise direction. In this case, the four blocking plates 211 included in the plurality of mask structures 210 may define the light transmitting region 21 to be quadrangular. Each blocking plate 211 may define a respective edge of the light transmitting region 21.

The plurality of mask structures 210 may be arranged so that normal surfaces thereof are perpendicular to the direction in which the laser beam LB1 proceeds and may be spaced apart from each other in a vertical direction (e.g., the Z direction), For example, when a thickness of the mask structure 210 in the vertical direction (e.g., the Z direction) is 300 μm to 500 μm, a distance 23 between mask structures 210 adjacent to each other in the vertical direction may be 100 μm to 200 μm.

Each of the plurality of mask structures 210 may include a transparent substrate 215, a blocking plate 211 that at least partially covers a first part of a surface of the transparent substrate 215, and a transmitting plate 213 that at least partially covers a second part of the surface of the transparent substrate 215.

The plurality of mask structures 210 may be arranged so that surfaces on which the blocking plates 211 are provided face upward or downward. For example, as illustrated 10, when the plurality of mask structures 210 are sequentially arranged in the direction in which the laser beam LB1 proceeds (e.g., from top to bottom) the blocking plates 211 and the transmitting plates 213 may be arranged on lower surfaces of the transparent substrates 215 in the first and third mask structures and, in the second and fourth mask structures the blocking plates 211 and the transmitting plates 213 may be arranged on upper surfaces of the transparent substrates 215.

The transparent substrates 215 may include a material having high transmittance with respect to the laser beam LB1. In an exemplary embodiment of the present inventive concept, the transparent substrates 215 may be formed of fused silica glass.

The blocking plates 211 may include a material having high reflectivity with respect to the laser beam LB1. In an exemplary embodiment of the present inventive concept, the blocking plates 211 may be high reflection (HR) coating layers deposited on the transparent substrates 215.

The transmitting plates 213 may increase transmittance with respect to the laser beam LB1. In an exemplary embodiment of the present inventive concept, the transmitting plates 213 may be anti-reflection (AR) coating layers deposited on the transparent substrates 215.

In an exemplary embodiment of the present inventive concept, the beam shaper 200 may include a driving device capable of linearly moving or rotating the plurality of mask structures 210. The beam shaper 200 may control a size of the light transmitting region 21 by linearly moving the plurality of mask structures 210 or may control a shape of the light transmitting region 21 by rotating the plurality of mask structures 210 about the rotation axis of the third direction (e.g., the Z direction) parallel to the direction in which the laser beam LB1 proceeds.

Figure 11:
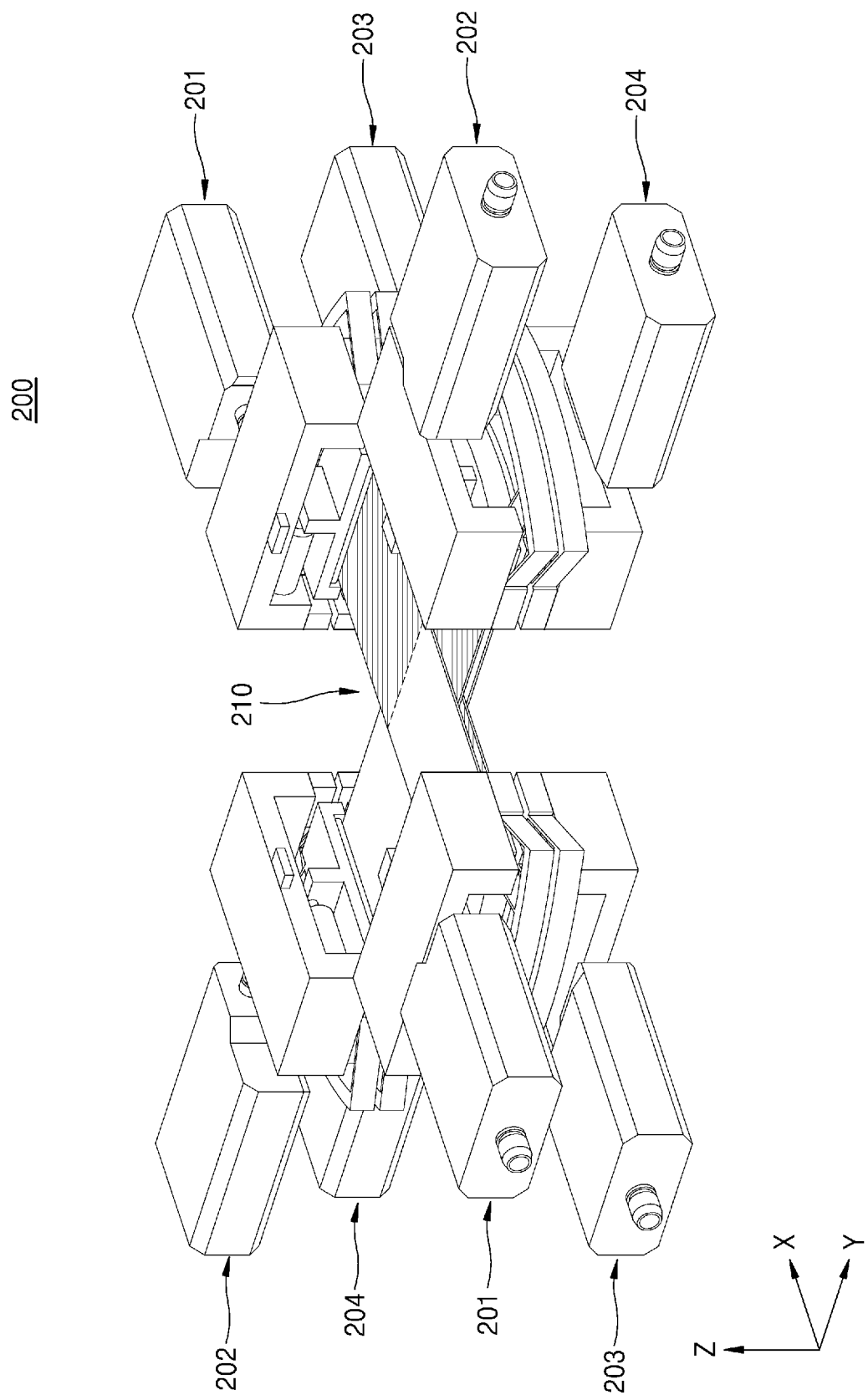
FIG. 11 is a perspective view illustrating a beam shaper according to an exemplary embodiment of the present inventive concept.
Figure 12:
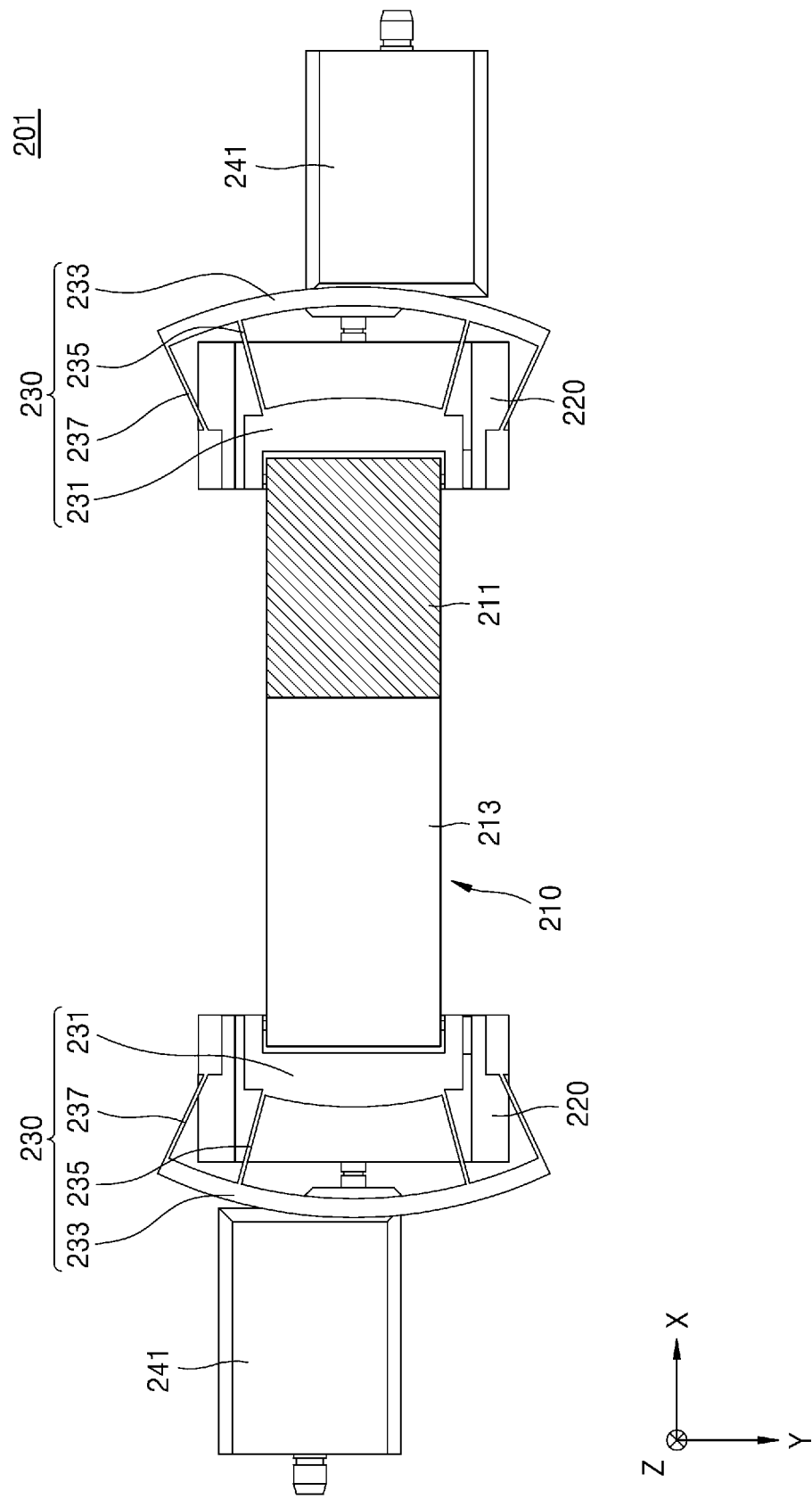
FIG. 12 is a plan view illustrating a first mask module of the beam shaper of FIG. 11, according to an exemplary embodiment of the present inventive concept.
Figure 13:
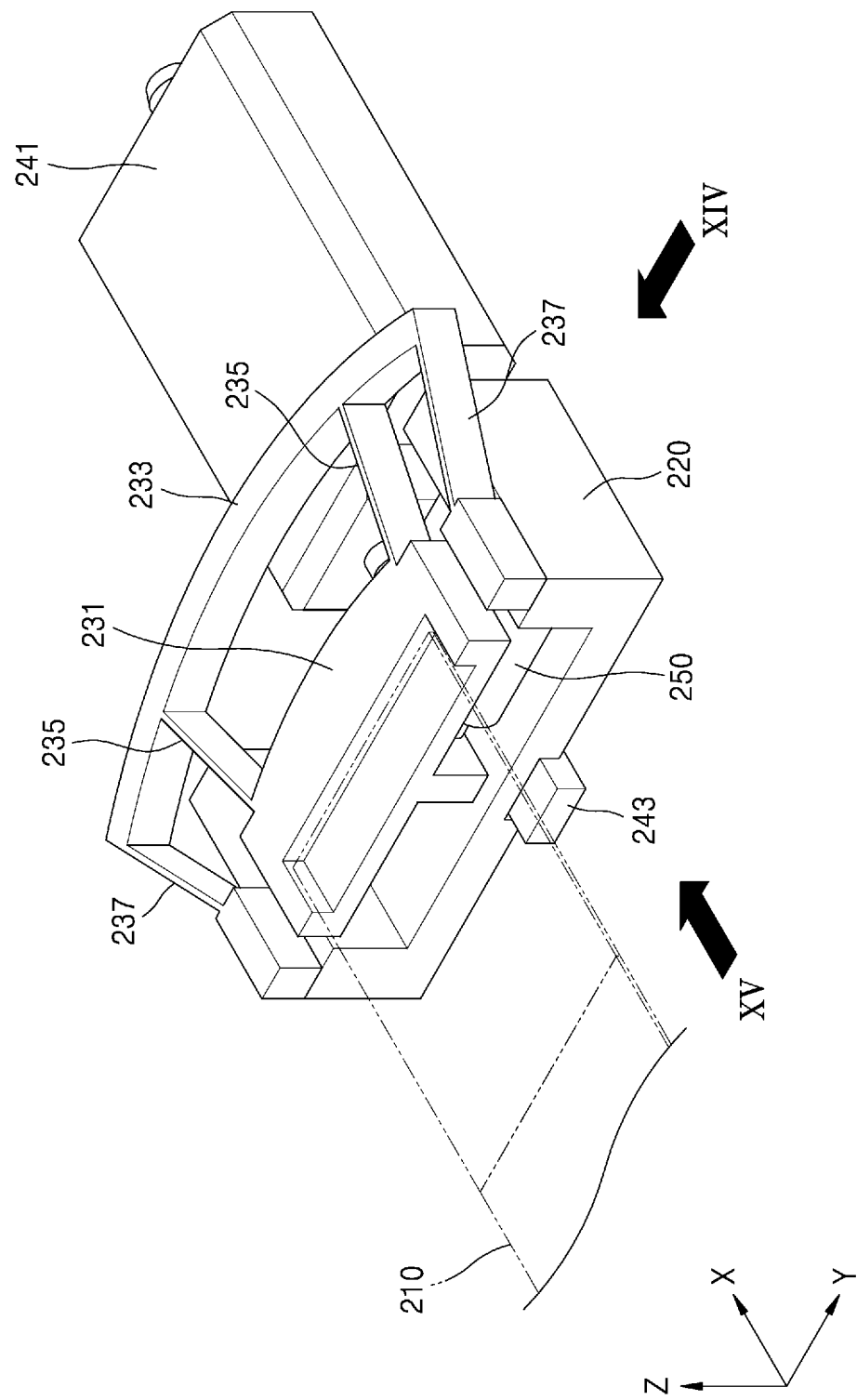
FIG. 13 is a perspective view illustrating a part of a first mask module of the beam shaper of FIG. 11, according to an exemplary embodiment of the present inventive concept.
Figure 14:
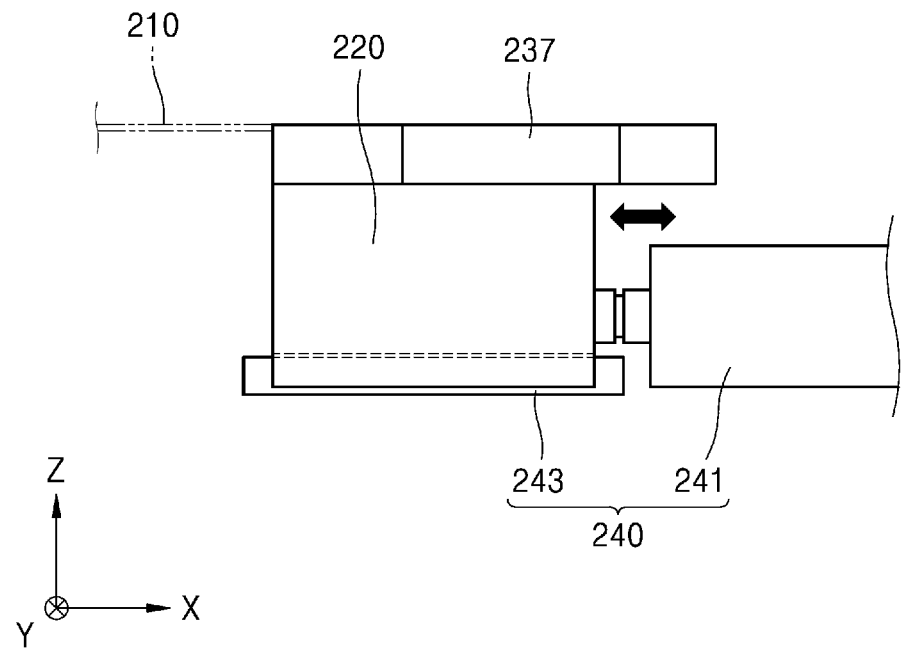
FIG. 14 is a side view illustrating a part of the first mask module seen in a direction of the arrow XIV of FIG. 13, according to an exemplary embodiment of the present inventive concept.
Figure 15:
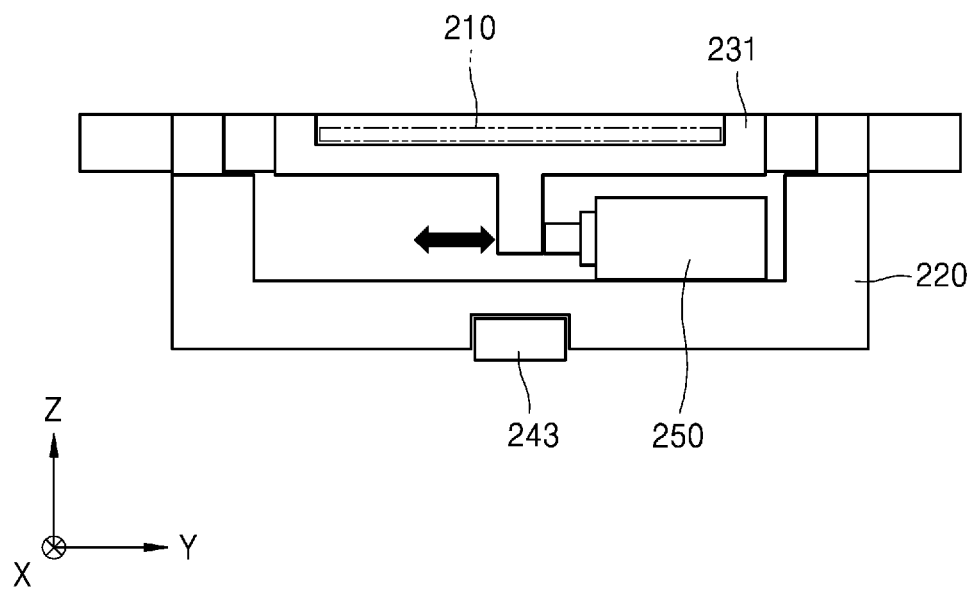
FIG. 15 is a side view illustrating a part of the first mask module seen in a direction of the arrow XV of FIG. 13, according to an exemplary embodiment of the present inventive concept.

FIG. 11 is a perspective view illustrating the beam shaper 200 according to an exemplary embodiment of the present inventive concept. FIG. 12 is a plan view illustrating first mask module 201 of the beam shaper 200 of FIG. 11. FIG. 13 is a perspective view illustrating a part of the first mask module 201 of the beam shaper 200 of FIG. 11. FIG. 14 is a side view illustrating a part of the first mask module 201 seen in a direction of the arrow XIV of FIG. 13. FIG. 15 is a side view illustrating a part of the first mask module 201 seen in a direction of the arrow XV of FIG. 13. In FIGS. 12 to 15, the first mask module 201 of FIG. 11 is illustrated as being flipped.

Referring to FIGS. 11, 12, 13, 14 and 15, the beam shaper 200 may include a plurality of mask modules. The plurality of mask modules may define a light blocking region and a light transmitting region 21 in cooperation with each other and may control a size and shape of the light transmitting region 21 in cooperation with each other.

For example, the beam shaper 200 may include the first to fourth mask modules 201, 202, 203, and 204 spaced apart from each other in a vertical direction (e.g., the Z direction). In a plan view, the second to fourth mask modules 202, 203, and 204 may be arranged in positions rotated at 90°, 180°, and 270° in the clockwise direction with respect to the first mask module 201 arranged at the uppermost portion.

Each of the first to fourth mask modules 201, 202, 203, and 204 may include the first to fourth mask structure 210. As described above with reference to FIGS. 9 and 10, the plurality of mask structures 210 may be stacked in a vertical direction (e.g., the Z direction) and the plurality of mask structures 210 included in the second to fourth mask modules 202, 203, and 204 may be arranged in positions rotated at 90°, 180°, and 270° with respect to the first mask structure 210 included in the first mask module 201.

Each of the first to fourth mask modules 201, 202, 203, and 204 may include a moving block 220, a rotary block 230, a linear driver 240, and a rotary driver 250.

The moving block 220 may be movably provided in a linear moving guide 243. For example, the moving block 220 may be guided by the linear moving guide 243 and may linearly reciprocate in the first horizontal direction (for example, the X direction) or the second horizontal direction (for example, the Y direction).

The rotary block 230 may support the mask structure 210, The rotary block 230 may be provided on the moving block 220 and may linearly move together with the moving block 220. In addition, the rotary block 230 may be provided on the moving block 220 so as to rotate with respect to the third direction (for example, the Z direction) parallel to the third direction in which the laser beam LB1 proceeds in a state in which the rotary block 230 supports the mask structure 210. For example, the rotary block 230 may have a rotary flexure structure in which at least a part of the rotary block 230 is elastically transformed by external force so that the rotary block 230 may perform a rotary motion with respect to the first direction (e.g., the X direction).

One mask module may include a pair of moving blocks 220 and a pair of rotary blocks 230. A first moving block 220 may be connected to a first rotary block 230 that supports a first end of the mask structure 210, and a second moving block 220 may be connected to a second rotary block 230 that supports a second end of the mask structure 210.

The linear driver 240 may linearly move the moving block 220. The linear driver 240 may control linear movement of the rotary block 230 and linear movement of the mask structure 210 supported by the rotary block 230 by controlling linear movement of the moving block 220. For example, the linear driver 240 may include a linear actuator 241, the linear moving guide 243 for guiding the linear movement of the moving block 220, and a linear encoder.

In an exemplary embodiment of the present inventive concept, linear movements of the pair of moving blocks 220 may be controlled by different linear drivers 240. At this time, the linear drivers 240 are controlled in parallel by a master-slave method and may prevent unintended pressure or tension from being applied to the mask structure 210.

The rotary driver 250 may rotate the rotary block 230 by using the third direction (e.g., the Z direction) as the rotation axis. The rotary driver 250 may include an actuator configured to apply external force for rotating the rotary block 230 to the rotary block 230. In an exemplary embodiment of the present inventive concept, the actuator of the rotary driver 250 may include a piezoelectric actuator. However, the present inventive concept is not limited thereto.

Figure 16:
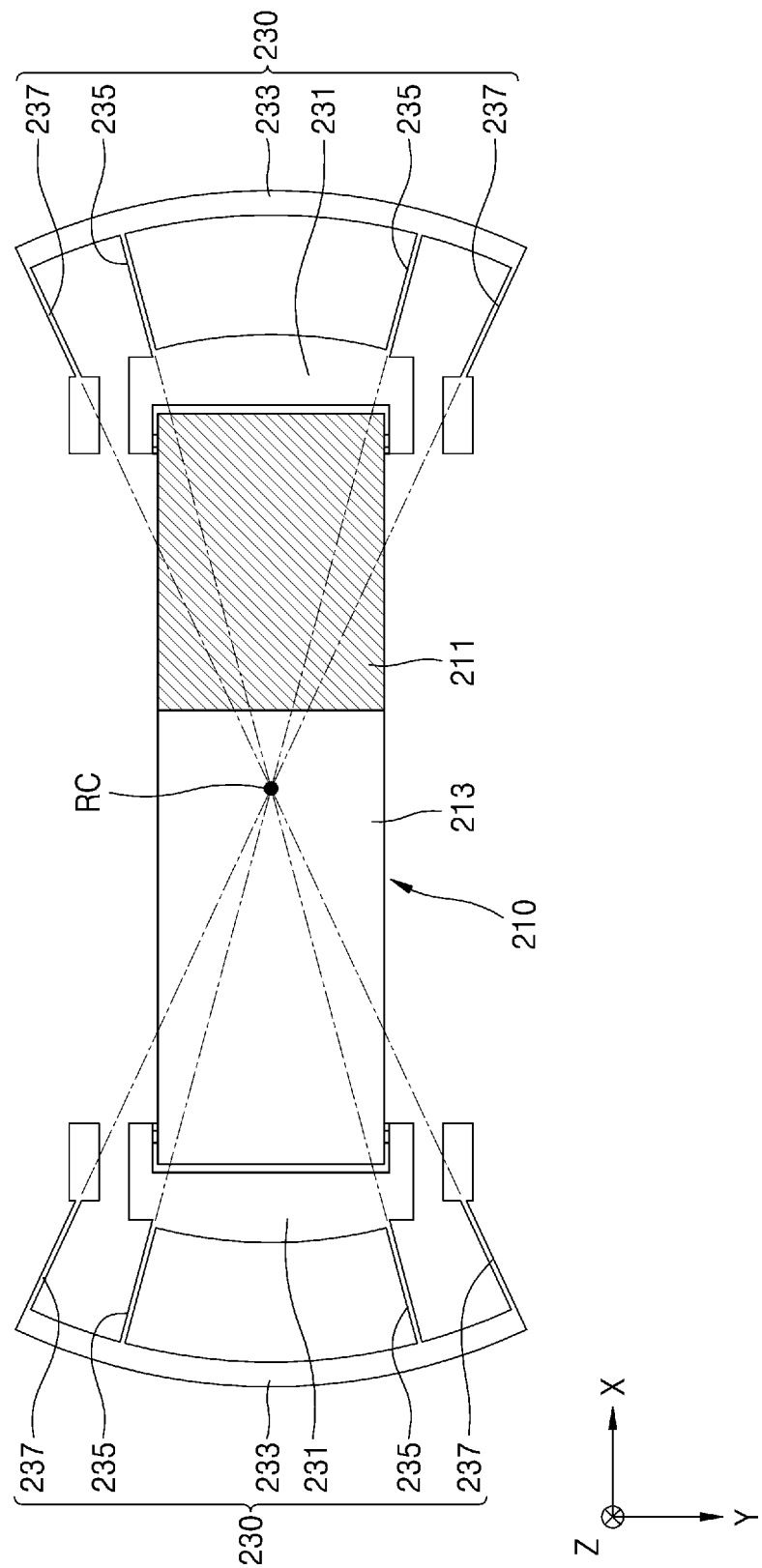
FIG. 16 is a plan view illustrating the virtual rotation center of a rotary block of a first mask module, according to an exemplary embodiment of the present inventive concept.

FIG. 16 is a plan view illustrating the virtual rotation center RC of the rotary block 230 of the first mask module 201.

Referring to FIG. 16 together with FIGS. 13, 14 and 15, the rotary block 230 may include a first stage 231 configured to support the mask structure 210 and to rotate with respect to the third direction (e.g., the Z direction), or the rotation axis. A second stage 233, which is arc-shaped, is spaced apart from the first stage 231. First flexure blades 235 connect the first stage 231 and the second stage 233 to each other, and second flexure blades 237 connect the second stage 233 and the moving block 220 to each other.

The first flexure, blade 235 may be a sheet-shaped member in which a width in a vertical direction (e.g., the Z direction) is greater than a width in a first horizontal direction (e.g., the X direction) or second horizontal direction (e.g., the Y direction). When external force is applied to the first flexure blade 235, the first flexure blade 235 may be easily transformed or bent in the first horizontal direction (e.g., the X direction) and the second horizontal direction (e.g., the Y direction) and might not be transformed or bent in the vertical direction (e.g., the Z direction). Therefore, the first flexure blades 235 may allow movement of the first stage 231 in the first horizontal direction (e.g., the X direction) or the second horizontal direction (e.g., the Y direction) and may limit movement of the first stage 231 in the vertical direction (e.g., the Z direction).

The second flexure blades 237 may be spaced apart from each other with the first flexure blades 235 therebetween. Like the first flexure blades 235, the second flexure blade 237 may be a sheet-shaped member in which a width in a vertical direction (e.g., the Z direction) is greater than a width in a horizontal direction (e.g., the Y direction). When external fierce is transmitted to the second flexure blade 237, the second flexure blade 237 may be easily transformed or bent in the first horizontal direction (e.g., the X direction) or the second horizontal direction (e.g., the Y direction) and might not be transformed or bent in the vertical direction (e.g., the Z direction).

The actuator of the rotary driver 250 may apply external force for rotating the first stage 231 to the first stage 231. For example, as illustrated in FIG. 15, the actuator of the rotary driver 250 may be connected to a first portion of the first stage 231 and may push or pull the first portion of the first stage 231 in one direction (for example, the Y direction).

When external force is applied by the actuator to the first stage 231, the first flexure blades 235 connected to the first stage 231 are elastically transformed and the first stage 231 and the mask structure 210 supported by the first stage 231 may rotate. The first stage 231 and the mask structure 210 supported by the first stage 231 may rotate around the virtual rotation center RC. The virtual rotation center RC may be an intersection point of extensions to the two second flexure blades 237.

In exemplary embodiments of the present inventive concept, rotations of the pair of rotary blocks 230 may be controlled by different rotary drivers 250, The rotary drivers 250 may be controlled in parallel by a master-slave method and may prevent unintended pressure or tension from being applied to the mask structure 210.

In general, since a mask for shaping a laser beam needs to be changed in accordance with a specific kind of equipment or a process condition, in order to design a mask suitable for new equipment or a new process condition, remarkable cost occurs. However, according to exemplary embodiments of the present inventive concept, since a mask optimized to a kind of equipment or a process condition may be rapidly changed while freely controlling a size and shape of a light transmitting region defined by a plurality of light blocking plates, the cost required for manufacturing a mask may be remarkably reduced and productivity of semiconductor manufacturing may increase.

While exemplary embodiments of the present inventive concept have been particularly shown and described heretofore, it will be understood that various changes in form and details may be made therein without departing from the spirit and scope of the present inventive concept.

What is claimed is:

1. A semiconductor manufacturing apparatus, comprising:
a beam shaper arranged on a light path of a laser beam and including a plurality of mask modules, the plurality of mask modules defining a light blocking region and a light transmitting region, wherein at least one mask module of the plurality of mask modules comprises:
a blocking plate configured to block a portion of the laser beam;
a driver configured to move the blocking plate;
a moving block movably provided in a linear moving guide; and
a flexure hinge connecting the moving block and the blocking plate.

2. The semiconductor manufacturing apparatus of claim 1, wherein the light transmitting region is an opening defined by blocking plates included in the plural of mask modules.

3. The semiconductor manufacturing apparatus of claim 1, wherein at least one mask module of the plurality of mask modules farther comprises a rotary driver configured to rotate the blocking plate with respect to a first direction, wherein the first direction is a rotation axis of the blocking plate.

4. The semiconductor manufacturing apparatus of claim 3, wherein the rotary driver controls skewness of the light transmitting region by rotating the blocking plate with respect to the first direction which is the rotation axis.

5. The semiconductor manufacturing apparatus of claim 1, wherein the blocking plate, the moving block, and the flexure hinge form one body.

6. The semiconductor manufacturing apparatus of claim 1, wherein the blocking plate comprises:
a first blocking plate including a blocking bar defining an edge of the light transmitting region and an opening defined between the blocking bar and the first blocking plate; and
a second blocking plate at least partially covering the opening of the first blocking plate.

7. The semiconductor manufacturing apparatus of claim 6, wherein at least one mask module of the plurality of mask modules comprises a bar actuator configured to apply external force to the blocking bar so that the one edge of the light transmitting region defined by the blocking bar is concave or convex.

8. The semiconductor manufacturing apparatus of claim 1, further comprising a stage on which a substrate is mounted, wherein the semiconductor manufacturing apparatus performs a laser annealing process on the substrate by using the laser beam shaped by the beam shaper.

9. A semiconductor manufacturing apparatus, comprising:
a light source configured to emit a laser beam; and
a beam shaper arranged on a light path of the laser beam and including a plurality of mask modules defining a light blocking region and a light transmitting region, wherein at least one mask module of the plurality of mask modules comprises:
a first blocking plate including a blocking bar defining an edge of the light transmitting region and an opening defined between the blocking bar and the first blocking plate;
a second blocking plate mounted on the first blocking plate to at least partially cover the opening of the first blocking plate; and
a bar actuator configured to apply external force to the blocking bar so that the edge of the light transmitting region is concave or convex.

10. The semiconductor manufacturing apparatus of claim 9, wherein at least one mask module of the plurality of mask modules comprises:
a moving block movably provided in a linear moving guide; and
a flexure hinge connecting the moving block and the first blocking plate, and
wherein the first blocking plate, the moving block, and the flexure hinge form one body.

11. The semiconductor manufacturing apparatus of claim 10, further comprising a rotary driver configured to apply external force for rotating the first blocking plate to the first blocking plate with respect to a first direction parallel to a direction in which the laser beam proceeds, wherein the first direction is a rotation axis, wherein the first blocking plate is rotated at the flexure hinge by the external force applied from the rotary driver.

12. The semiconductor manufacturing apparatus of claim 10, wherein at least one mask module of the plurality of mask modules thither comprises a linear actuator configured to linearly move the moving block.

13. The semiconductor manufacturing apparatus of claim 9, wherein the bar actuator comprises a piezoelectric actuator.

14. A semiconductor manufacturing apparatus, comprising:
a light source configured to emit a laser beam; and
a beam shaper arranged on a light path of the laser beam and including a plurality of mask modules defining a light blocking region and a light transmitting region,
wherein each of the plurality of mask modules comprises:
a mask structure including a transparent substrate and a blocking plate, the blocking plate covering a first part of one surface of the transparent substrate;
a moving block movably provided in a linear moving guide;
a first stage configured to support the mask structure and to rotate with respect to a first direction parallel to a direction in which the laser beam proceeds, the first direction is a rotation axis;
a second stage spaced apart from the first stage;
first flexure blades connecting the first stage and the second stage;
second flexure blades connecting the second stage and the moving block; and
a rotary driver configured to apply external force to the first stage for rotating the first stage.

15. The semiconductor manufacturing apparatus of claim 14, wherein the mask structure further comprises a transmitting plate covering a second part of the surface of the transparent substrate.

16. The semiconductor manufacturing apparatus of claim 15, wherein the blocking plate includes a high reflection (HR) coating layer, and wherein the transmitting plate includes an anti-reflection coating layer.

17. The semiconductor manufacturing apparatus of claim 14, wherein each of the plurality of mask modules further comprises a linear actuator configured to linearly move the moving block.

18. The semiconductor manufacturing apparatus of claim 14, wherein when the mask structure is provided in plural, each of the plurality of mask modules are spaced apart from each other in a vertical direction.

* * * * *